US006959427B2

(12) United States Patent
Kimura (10) Patent No.: US 6,959,427 B2
(45) Date of Patent: Oct. 25, 2005

(54) SEMICONDUCTOR DEVICE SIMULATION METHOD, SEMICONDUCTOR DEVICE AND FABRICATION METHOD THEREOF, CIRCUIT BOARD, ELECTRO-OPTICAL APPARATUS, AND ELECTRONIC DEVICE

(75) Inventor: Mutsumi Kimura, Kyotanabe (JP)

(73) Assignee: Seiko Epson Corporation, Tokyo (JP)

( * ) Notice: Subject to any disclaimer, the term of this patent is extended or adjusted under 35 U.S.C. 154(b) by 256 days.

(21) Appl. No.: 10/397,422

(22) Filed: Mar. 27, 2003

(65) Prior Publication Data

US 2004/0079943 A1   Apr. 29, 2004

(30) Foreign Application Priority Data

Mar. 29, 2002 (JP) .............................. 2002-097300
Mar. 26, 2003 (JP) .............................. 2003-086025

(51) Int. Cl.$^7$ ............................................ G06F 17/50
(52) U.S. Cl. .................... 716/4; 716/20; 703/2; 703/13
(58) Field of Search .......................... 716/4, 20; 703/2, 703/13

(56) References Cited

U.S. PATENT DOCUMENTS

| | | | | |
|---|---|---|---|---|
| 5,682,338 A | * | 10/1997 | Yokota et al. | ................. 703/13 |
| 5,684,723 A | * | 11/1997 | Nakadai | ..................... 716/20 |
| 5,828,586 A | * | 10/1998 | Yokota | ........................ 716/20 |
| 6,023,575 A | * | 2/2000 | Yokota et al. | ................. 703/12 |
| 6,144,929 A | * | 11/2000 | Kumashiro | .................... 703/2 |
| 6,304,834 B1 | * | 10/2001 | Enda | .............................. 703/4 |
| 2002/0010564 A1 | * | 1/2002 | Yokota | ........................... 703/2 |

OTHER PUBLICATIONS

Uraoka, 2001 FPD Technology Encyclopedia, Ekectronic Journal, pp. 124-126 {2000} w/ partial translation.
Ino, 2001 FPD Technology Encyclopedia, Electronic Journal, pp 127-136 {2000}.
Kimura, "Development of Device, Circuit and Liquid-Crystal Simulators for Polycrystalline Silicon Thin-Film Transistors and their Applications", Dissertion for Doctor of Philosophy, pp iii-v {2001} w/ partial translation.
Selberherr, "Analysis and Simulation of Semiconductor Devices", pp. 149-201 {1984}.
Taniguchi, "Latest Processed, Device Simulation Technologies," pp. 161-199 {1990}w/ partial translation.
Tomisawa, "Semiconductor Device Simulation," pp. 147-181 {1996} w/ partial translation.
Silvaco International, "Atlas User's Manual: Simulation Software," vol. 1, pp 2-1 - 2-47 {Dec. 2002}.

* cited by examiner

Primary Examiner—Leigh M. Garbowski
(74) Attorney, Agent, or Firm—Oliff & Berridge, PLC (57) ABSTRACT

The present invention provides an accurate and high-precision semiconductor device simulation method that is directed toward an electronic device whose physicality is not isotropic because the mobility of an organic thin film transistor, that employs an organic semiconductor, and the like, is highly dependent on field strength. In a semiconductor device simulation method which divides a semiconductor device of a two-dimensional structure or three-dimensional structure into meshes, and solves physical equations such as a potential equation and a carrier transport equation, for the meshes, a drift current resulting from an electric field and a diffusion current caused by a carrier density gradient are handled separately.

17 Claims, 8 Drawing Sheets

SEMICONDUCTOR DEVICE SIMULATION METHOD, SEMICONDUCTOR DEVICE AND FABRICATION METHOD THEREOF, CIRCUIT BOARD, ELECTRO-OPTICAL APPARATUS, AND ELECTRONIC DEVICE

BACKGROUND OF THE INVENTION

1. Field of the Invention

The present invention relates to a semiconductor device simulation method, and more particularly to an accurate and high-precision semiconductor device simulation method that is directed toward organic thin film transistors, a semiconductor device and fabrication method thereof, and a circuit board, electro-optical apparatus and electronic apparatus.

2. Description of the Related Art

Semiconductor device simulation involves predicting the characteristics of semiconductor devices from the structure and material properties, and so forth, of semiconductor devices or analyzing the operation of such devices. Objects of this simulation are an improvement in development efficiency by means of a decrease in the number of manufacturing experiments, the implementation of the optimum design by means of a comparison of a multiplicity of characteristics, and the proposal of development guidelines through estimation of the characteristics of transitional structures and material properties. Currently, semiconductor device simulation, which is directed toward crystal semiconductor devices, amorphous thin film transistors, and polycrystalline silicon thin film transistors, and the like, is an essential tool for research and development (Yukiharu Uraoka, 2001 FPD Technology Encyclopedia (Electronic Journal, Tokyo, 2000) 124, Yoshihisa Ino, 2001 FPD Technology Encyclopedia (Electronic Journal, Tokyo, 2000) 127, M. Kimura, Dissertation for Ph. D. (Tokyo University of Agriculture and Technology, Koganei, 2001)).

Conventional semiconductor device simulation methods include the following (S. Selberherr, Analysis and Simulation of Semiconductor Devices (Springer-Verlag, Vienna, 1984), Kenji Taniguchi, Latest processes, device simulation technologies (Realize Inc., Tokyo, 1990), Kazutaka Tomisawa, Semiconductor device simulation (Corona Publishing Co., Tokyo, 1996), Atlas User's Manual, Device Simulation Software (Silvaco International, Santa Clara, 2000)). First of all, a semiconductor device with a two-dimensional structure or three-dimensional structure, that is, semiconductors, insulators, electrodes, and peripheral spaces thereof, and so forth, of a two-dimensional structure or three-dimensional structure, are divided into meshes. Next, physical equations such as a potential equation and a carrier transport equation are established and solved for the meshes. A Poisson equation, which is a potential equation, and electron and positive-hole carrier continuity equations constituting carrier transport equations are as follows:

Poisson equation:

$$\Delta\psi = -\rho/\in$$

$\psi$: potential
$\rho$: charge volume density
$\in$: permittivity

Electron carrier continuity equation:

$$-nn\nabla\cdot(\mu nE)-\nabla\cdot(Dn\nabla nn)-G=0$$

nn: electron carrier density
$\mu$n: electron mobility
E: electric field
Dn: electron diffusion coefficient
G: carrier generation/annihilation rate Positive-hole carrier continuity equation $$-np\nabla\cdot(\mu pE)-\nabla\cdot(Dp\nabla np)-G=0$$

np: positive hole carrier density
$\mu$p: positive hole mobility
E: electric field
Dp: positive hole diffusion coefficient
G: carrier generation/annihilation rate.

The Finite Element Method, and difference methods, and so on, are employed as methods for establishing the equations. Further, a variety of matrix resolving methods may be used as methods for solving the equations. These equations are iterated and solved so as to converge, and, finally, the capacitance-voltage characteristics, and the transistor characteristics, and so forth are calculated in addition to the potential, carrier density, carrier flow density, and so forth.

In the above carrier continuity equations, the first term is the drift current resulting from the electric field, and the second term is the diffusion current caused by the carrier density gradient. As far as the electron and positive-hole carrier continuity equations are concerned, in cases where the physicality of the semiconductor is isotropic, the equations are arranged with the drift current and diffusion current taken together, and may be rewritten as follows:

Electron carrier continuity equation:

$$\nabla\cdot(-nn\mu nE-Dn\nabla nn)-G=0$$

Positive hole carrier continuity equation:

$$\nabla\cdot(-np\mu pE-Dp\nabla np)-G=0$$

As far as the mobility expressed by the drift current equation and the diffusion coefficient expressed by the diffusion current equation are concerned, in cases where the semiconductor physicality is isotropic, the following Einstein relation is established (R. P. Feynman, The Feynman Lectures on Physics (Addison-Wesley, Massachusetts, 1965), S. M. Sze, Physics of Semiconductor Devices, $2^{nd}$ ed. (John Wiley and Sons, New York, 1981)).

Einstein's relation:

$$Dn/\mu n = Dp/\mu p = kT/q$$

Using Einstein's relation, the electron and positive-hole carrier continuity equations may be rewritten as follows:

Electron carrier continuity equation:

$$\mu n\nabla\cdot(-nnE-kT\nabla nn/q)-G=0$$

Positive hole carrier continuity equation:

$$\mu p\nabla\cdot(-npE-kT\nabla np/q)-G=0$$

Conventional semiconductor device simulation methods employ the electron and positive-hole carrier continuity equations detailed above.

Recently, as means for implementing lightweight, thin-type, flexible displays typified by liquid crystal displays, electroluminescence displays, and electrophoresis displays, and the like, or lightweight, thin-type, flexible sensors typified by scanners and X-ray detectors and so forth, organic thin film transistors have been the subject of active research and development (N. C. Greenham and R. H. Friend, Solid State Phys. 49, G. Horowitz, J. Appl. Phys. 70 (1991) 469, K. Waragai, Synth. Met. 55–57 (1993) 4053, L. Torsi, J. Appl. Phys. 78 (1995) 1088, G. Horowitz, J. Phys III France (1995) 355, A. R. Brown, Synth. Met. 88(1997) 37, G. Horowitz, Adv. Mater. 10(1998) 365, R. Tecklenburg, Adv. Mater. Opt. Electron. 8(1998) 285, F. Schauer, J. Appl.

Phys. 86 (1999) 524, H. Sirringhaus, T. Kawase, R. H. Friend, T. Shimoda, Science 290 (2000) 2123, T. Kawase, R. H. Friend, T. Shimoda, Tech. Dig. Int. Electron Devices Meeting 2000, 623, T. Kawase, R. H. Friend, T. Shimoda, Dig. Society for Information Display 01, 40, Yoshikazu Kondou, IEICE Journal J84-C, (2001) 1050). As is true for crystal semiconductor devices, amorphous thin film transistors, and polycrystalline silicon thin film transistors, and the like, semiconductor device simulation is expected to be an essential tool in the research and development of organic thin film transistors.

Where semiconductor device simulation methods directed toward organic thin film transistors are concerned, one point to bear in mind is that, in organic semiconductor devices, mobility is highly dependent on field strength. In other words, in cases where an electric field is present, when the physicality of the semiconductor is not isotropic, the above-described Einstein relation is not established, and hence it is not possible to use the above-described electron and positive-hole carrier continuity equations.

SUMMARY OF THE INVENTION

Therefore, an object of the present invention is to obtain an accurate and high-precision semiconductor device simulation method that is directed toward an organic thin film transistor that employs an organic semiconductor in which mobility is highly dependent on field strength.

Further, another object of the present invention is to provide a semiconductor device which is designed by calculating the potential, carrier density and carrier flow density by means of this simulation method, and then determining the device parameters on the basis of these calculated values.

In order to achieve the above objects, a first aspect of the present invention is: a semiconductor device simulation method which divides a semiconductor device of a two-dimensional structure or three-dimensional structure into meshes, and solves physical equations such as a potential equation and a carrier transport equation, for each of the meshes, wherein a drift current resulting from an electric field and a diffusion current caused by a carrier density gradient are handled separately.

According to this semiconductor device simulation method, an accurate and high-precision semiconductor device simulation method can be obtained for the semiconductor device in which the physicality of the semiconductor is not isotropic, and hence a fixed relationship between the drift current and the diffusion current does not exist.

More preferably, in the case of the above semiconductor device simulation method, mobility, which is expressed by an equation for the drift current, and a diffusion coefficient, which is expressed by an equation for the diffusion current, are handled as independent constants.

According to this semiconductor device simulation method, an accurate and high-precision semiconductor device simulation method can be obtained for the semiconductor device in which the physicality of the semiconductor is not isotropic, and hence Einstein's relation is not established between the mobility expressed by the drift current equation and the diffusion coefficient expressed by the diffusion current equation.

More preferably, in the case of the above semiconductor device simulation method, the semiconductor device is an organic thin film transistor.

According to this semiconductor device simulation method, an accurate and high-precision semiconductor device simulation method can be obtained for an organic thin film transistor employing an organic semiconductor in which the physicality of the semiconductor is not isotropic because the mobility is highly dependent on the field strength, and hence a fixed relationship between the drift current and the diffusion current does not exist, and Einstein's relation is not established between the mobility expressed by the drift current equation and the diffusion coefficient expressed by the diffusion current equation.

Also, a second aspect of the present invention is a semiconductor device designed by determining device parameters based on potential, carrier density and carrier flow density, the potential, the carrier density and the carrier flow being calculated by a semiconductor device simulation method which divides the semiconductor device of a two-dimensional structure or three-dimensional structure into meshes and solves physical equations such as a potential equation and a carrier transport equation, for each of the meshes, and the semiconductor device simulation method calculating the potential, the carrier density and the carrier flow by handling separately a drift current resulting from an electric field and a diffusion current caused by a carrier density gradient.

As a result of implementing this constitution, a semiconductor device that has an optimized device structure is obtained in a transistor in which the semiconductor device physicality is not isotropic. The present invention also provides an electro-optical apparatus that comprises the semiconductor device having the device structure of the present invention, and an electronic device. The semiconductor device having the device structure of the present invention can also be applied as a driver circuit and may be provided as a circuit board that comprises this driver circuit. It goes without saying that the semiconductor device of the present invention could also be applied as a switching device in an active matrix substrate which is employed in an electro-optical apparatus, and that the circuit board of the present invention also includes an active matrix substrate of this kind. The semiconductor device of the present invention could also be applied as a driver circuit and switching device in an active matrix substrate constituted such that the driver circuit is formed on the same substrate.

Furthermore, a third aspect of the present invention is a semiconductor device simulation method which divides a semiconductor device into a plurality of regions, and calculates device characteristics of the semiconductor device by solving physical equations which include a drift current term based on a drift current generated by carrier drift, and a diffusion current term based on a diffusion current produced by diffusion of the carriers, for each of the divided regions, comprising: an extraction step of extracting the drift current term and the diffusion current term from these physical equations; a substitution step of substituting mobility of the carriers in the plurality of regions for the respective drift current term thus extracted, substituting a diffusion coefficient for the carriers in the plurality of regions for the respective diffusion current term thus extracted, and thus calculating the drift current term and the diffusion current term; a generating step of generating the physical equations for the plurality of regions based on the drift current term and the diffusion current term calculated in the substitution step; and a calculating step of calculating the device characteristics by solving the plurality of physical equations thus generated.

According to this semiconductor device simulation method, an accurate and high-precision semiconductor device simulation method can be obtained for the semiconductor device in which the physicality of the semiconductor is not isotropic, and hence a fixed relationship between the drift current and the diffusion current does not exist.

More preferably, the generating step generates the physical equations by calculating a vector sum of the drift current term and the diffusion current term which are calculated in the substitution step, and the calculating step solves the physical equations by performing a matrix calculation based on the plurality of physical equations.

According to this semiconductor device simulation method, an accurate and high-precision semiconductor device simulation method can be obtained for the semiconductor device in which the physicality of the semiconductor is not isotropic, and hence Einstein's relation is not established between the mobility expressed by the drift current equation and the diffusion coefficient expressed by the diffusion current equation.

More preferably, the calculating step calculates the mobility distribution and the diffusion coefficient distribution of the semiconductor device as the device characteristics.

According to this semiconductor device simulation method, the field strength distribution of the semiconductor device as well as the dopant distribution thereof can be suitably grasped in the design of the semiconductor device in which the physicality of the semiconductor is not isotropic, and hence Einstein's relation is not established between the mobility expressed by the drift current equation and the diffusion coefficient expressed by the diffusion current equation.

Further, a fourth aspect of the present invention is a semiconductor device fabrication method that comprises a step of designing a semiconductor device by means of the above-mentioned semiconductor device simulation method.

According to this semiconductor device fabrication method, even in cases where the physicality of the semiconductor is not isotropic, a semiconductor device having an optimized device structure can be fabricated. The present invention also provides an electro-optical apparatus that comprises the semiconductor device having the device structure fabricated by the semiconductor device fabrication method of the present invention, and an electronic device. Here, 'electro-optical apparatus' refers generally to a device that comprises an electro-optical device which is caused to emit light or change the state of light from outside as a result of an electrical operation. Clearly, the term 'electro-optical apparatus' includes devices that emit light as well as devices that control the passage of light from outside. For example, E/O devices include liquid crystal devices, electrophoretic devices, EL (electroluminescence) devices, electron emission devices which induce light emission by causing electrons generated by the application of an electric field to strike a light emission plate. Further, 'electronic device' refers generally to a device that affords a fixed function by means of a combination of a plurality of devices or circuits, and such a device is constituted comprising an electro-optical apparatus, and a memory, and the like, for example. Here, an electronic device can comprise one or a plurality of circuit boards. The constitution of the electronic device is more particularly not limited and may include, for example, IC cards, cellular phones, video cameras, personal computers, head-mounted displays, rear- or front-type projectors, fax machines equipped with a display function, digital camera view finders, portable TVs, DSP devices, PDAs, electronic notebooks, electronic signs, and publicity displays, and so forth.

DESCRIPTION OF THE PREFERRED EMBODIMENTS

Preferred embodiments of the present invention will be described below, but the following embodiments do not limit the inventions according to the scope of the claims, and all the combinations of characteristics described in these embodiments are not required by the resolving means of the invention.

Figure 1:
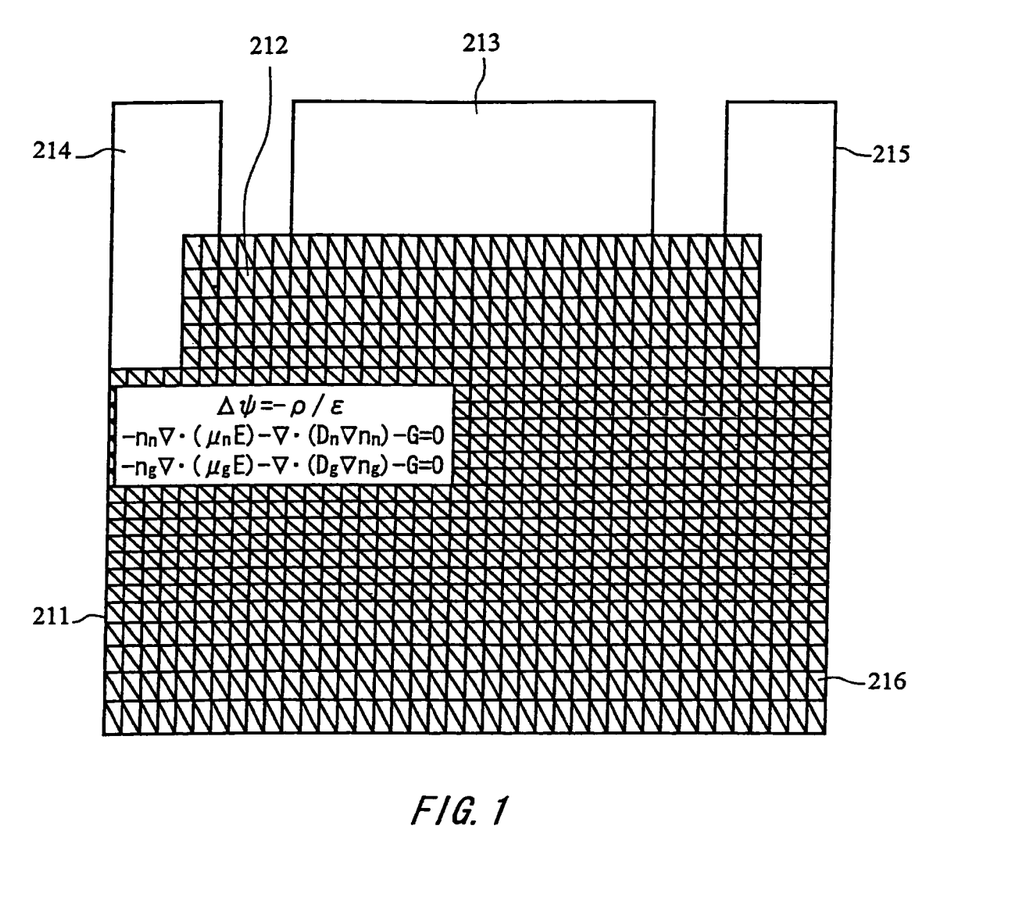
FIG. 1 shows a semiconductor device simulation model according to the present invention.
Figure 2:
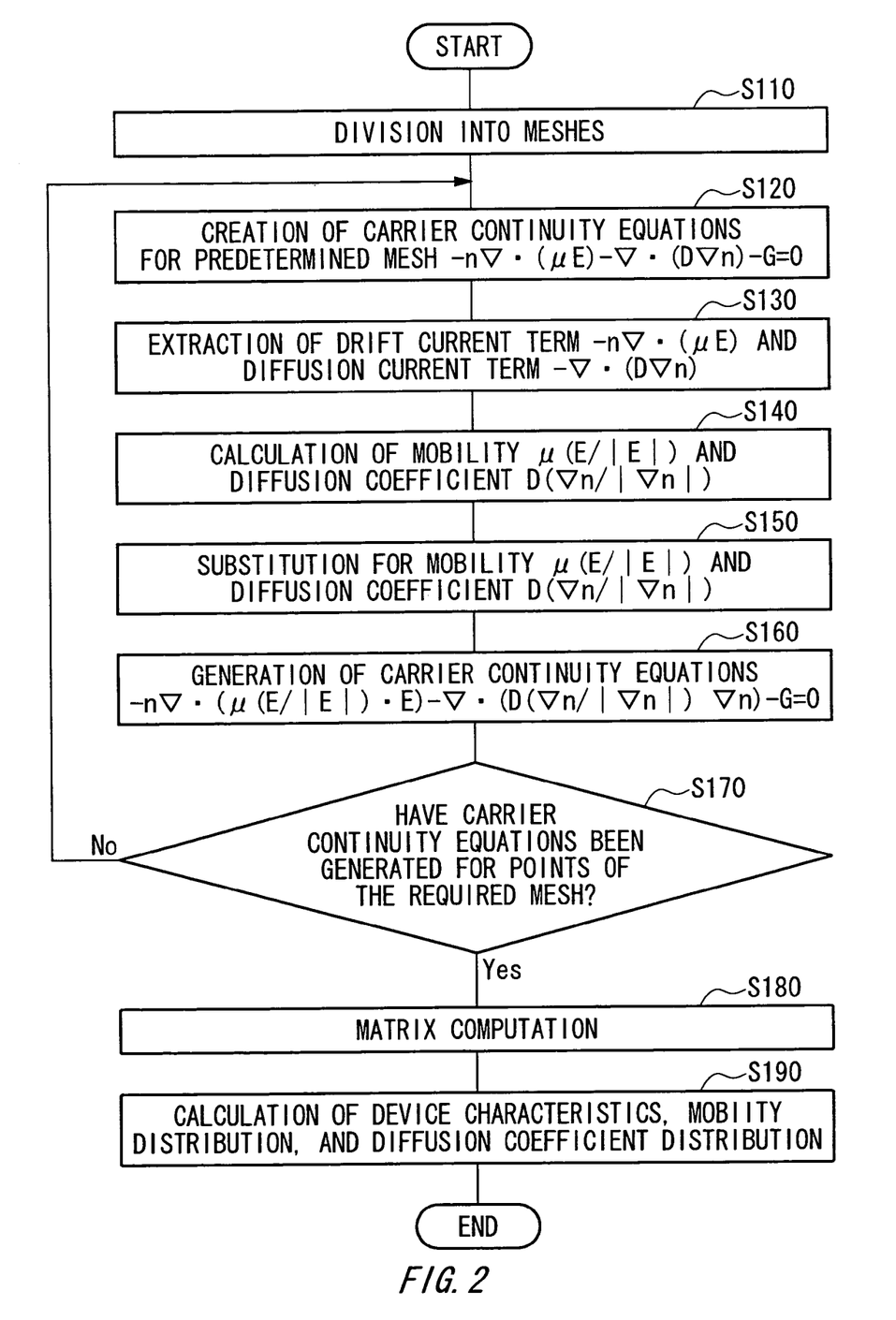
FIG. 2 is a flowchart of the semiconductor device simulation method according to the present embodiment.

FIG. 1 shows a semiconductor device simulation method according to a first embodiment of the present invention, and FIG. 2 is a flowchart for the semiconductor device simulation method according to this embodiment. The semiconductor device simulation method according to this embodiment will now be described using an organic thin film transistor as an example of a semiconductor device. The organic thin film transistor in this example is constituted comprising an organic semiconductor 211; an insulation film 212 formed on the surface of the organic semiconductor 211; a gate electrode 213 formed on the insulation film 212; and a source electrode 214 and drain electrode 215 which are formed with the gate electrode 213 interposed therebetween on the organic semiconductor 211.

First of all, a semiconductor device with a two-dimensional structure or three-dimensional structure, that is, semiconductors, insulators, electrodes, and peripheral spaces thereof, and so forth, of a two-dimensional structure or three-dimensional structure, are divided into meshes (S110). In this example, the organic semiconductor 211 and insulation film 212 of a cross-section of the above organic thin film transistor are divided into a plurality of regions which are shown as a plurality of meshes 216.

Next, physical equations such as a potential equation and a carrier transport equation are established for the meshes 216 (S120). A Poisson equation which is a potential equation, and electron and positive-hole carrier continuity equations constituting carrier transport equations are as follows:

Poisson equation:

$$\Delta \psi = -\rho/\in$$

$\psi$: potential
$\rho$: charge volume density
$\in$: permittivity

Electron carrier continuity equation:

$$-nn\nabla \cdot (\mu n E) - \nabla \cdot (Dn \nabla nn) - G = 0$$

nn: electron carrier density
$\mu$n: electron mobility
E: electric field
Dn: electron diffusion coefficient
G: carrier generation/annihilation rate Positive-hole carrier continuity equation $$-np\nabla \cdot (\mu p E) - \nabla \cdot (Dp \nabla np) - G = 0$$

np: positive hole carrier density
$\mu$p: positive hole mobility
E: electric field
Dp: positive hole diffusion coefficient
G: carrier generation/annihilation rate.

Thereafter, a drift current term and a diffusion current term are extracted from the respective carrier continuity equations for the electrons and positive holes which are established in S120 (S130). The drift current term is a term that is based on the drift current generated by the drift of carriers in the organic semiconductor 211. In this example, $-n\nabla \cdot (\mu E)$ is extracted as the drift current term, this being a term that has the drift current as a variable in the carrier continuity equations. Also, the diffusion current is a term that is based on the diffusion current generated by the diffusion of carriers in the organic semiconductor 211. In this example, $-\nabla \cdot (D\nabla n)$ is extracted as the diffusion current, this being a term that has the diffusion current as a variable in the carrier continuity equations.

Next, the value of the mobility $\mu(E/|E|)$ is calculated as a function of the field strength in the drift current direction of the drift current term, and the value of the diffusion coefficient $D(\nabla n/|\nabla|)$ is calculated as a function of the field strength in the diffusion current direction of the diffusion current term (S140). Next, the mobility and diffusion coefficient calculated in S140 are substituted for the drift current term $-n\nabla \cdot (\mu E)$ and the diffusion current term $-\nabla \cdot (D\nabla n)$ which were extracted in S130 (S150). Accordingly, $-n\nabla \cdot (\mu(E/|E|) \cdot E)$ and $-\nabla \cdot (D\nabla n/|\nabla|)\nabla n)$ are obtained for the drift current term and the diffusion current term respectively.

Then carrier continuity equations are generated by calculating a vector sum of the drift current term and the diffusion current term obtained in S150 (S160). By repeating the same steps, the carrier continuity equations are generated for points of the required mesh 216 (S170). Then, by using matrix computation to solve the carrier continuity equations generated for the meshes 216 (S180), various device characteristics of the organic thin film transistor, as well as the mobility distribution and diffusion coefficient distribution thereof, and so forth, can be obtained (S190).

According to the semiconductor device simulation method of this embodiment, even in the case of a device such as an organic thin film transistor for which Einstein's relation cannot be established between the mobility and the diffusion coefficient of this transistor because the mobility is highly dependent on the field strength, for example, the characteristics thereof can be simulated with a high degree of precision. Accordingly, even in cases where the semiconductor device comprises an organic thin film transistor and the like, this semiconductor device can be designed by suitably determining the device parameters by means of simulation. Furthermore, according to the semiconductor device simulation method of this embodiment, the carrier mobility distribution and the diffusion coefficient distribution of the organic thin film transistor can be obtained. The field strength distribution of the semiconductor device as well as the dopant distribution thereof can thus be suitably grasped in the design of the semiconductor device.

The Finite Element Method, and difference methods, and so on are employed as methods for establishing the equations. Further, a variety of matrix resolving methods are used as methods for solving the equations. These equations are iterated and solved so as to converge, and, finally, device characteristics such as the capacitance-voltage characteristics, and the transistor characteristics are calculated in addition to the potential, carrier density, carrier flow density, and so forth.

In the above carrier continuity equations, the first term is the drift current resulting from the electric field, and the second term is the diffusion current caused by the carrier density gradient. In the present embodiment, the drift current resulting from the electric field and the diffusion current caused by the carrier density gradient are handled separately. Accordingly, an accurate and high-precision semiconductor device simulation method can be obtained for the semiconductor device in which the physicality of the semiconductor is not isotropic, and hence a fixed relationship between the drift current and the diffusion current does not exist. Moreover, in the present embodiment, the mobility expressed by the drift current equation and the diffusion coefficient expressed by the diffusion current equation are handled as individual constants. Accordingly, an accurate and high-precision semiconductor device simulation method can be obtained for the semiconductor device in which the physicality of the semiconductor is not isotropic, and hence Einstein's relation is not established between the mobility expressed by the drift current equation and the diffusion coefficient expressed by the diffusion current equation. Further, the semiconductor device as per the present embodiment is an organic thin film transistor. Accordingly, an accurate and high-precision semiconductor device simulation method can be obtained for an organic thin film transistor employing an organic semiconductor in which the physicality of the semiconductor is not isotropic because the mobility is highly dependent on the field strength, and hence a fixed relationship between the drift current and the diffusion current does not exist, and Einstein's relation is not established between the mobility expressed by the drift current equation and the diffusion coefficient expressed by the diffusion current equation.

Figure 3:
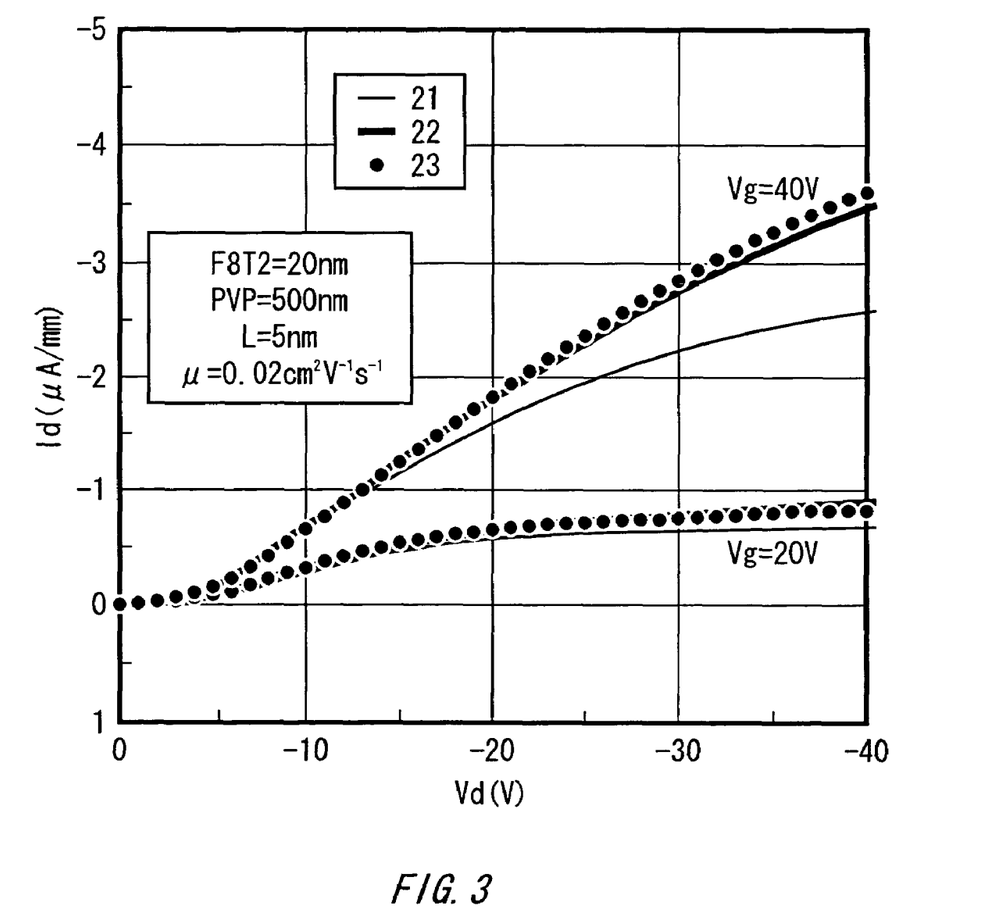
FIG. 3 shows the respective transistor characteristics produced by a conventional semiconductor device simulator and by the semiconductor device simulation method according to the present invention.

FIG. 3 shows the results of simulations of transistor characteristics by means of a conventional semiconductor device simulation method and by the semiconductor device simulation method according to the present invention. An organic thin film transistor is taken as an example of a semiconductor device, and the structure thereof as well as the procedure of the semiconductor device simulation method, and so forth, are as described above. The mobility, diffusion coefficient and field dependence thereof are optimized from the actual values. The semiconductor device simulation method according to the present invention shows transistor characteristics which are closer to the actual values than conventional semiconductor device simulation methods, and it can be seen that an accurate and high-precision semiconductor device simulation method can be obtained by the semiconductor device simulation method according to the present invention.

Furthermore, in the present embodiment, the semiconductor device is an organic thin film transistor. However, the ideas of the present invention are equally valid for a semiconductor device employing another type of semiconductor in which the physicality of the semiconductor is not isotropic because the mobility is highly dependent on the field strength, and hence a fixed relationship between the drift current and the diffusion current does not exist, and Einstein's relation is not established between the mobility expressed by the drift current equation and the diffusion coefficient expressed by the diffusion current equation.

(Design Procedure for the Semiconductor Device of the Present Invention)

Next, the procedure for optimizing the device parameters of the semiconductor device that is to be designed, by means of the above-described device simulation method will be described below.

Figure 4:
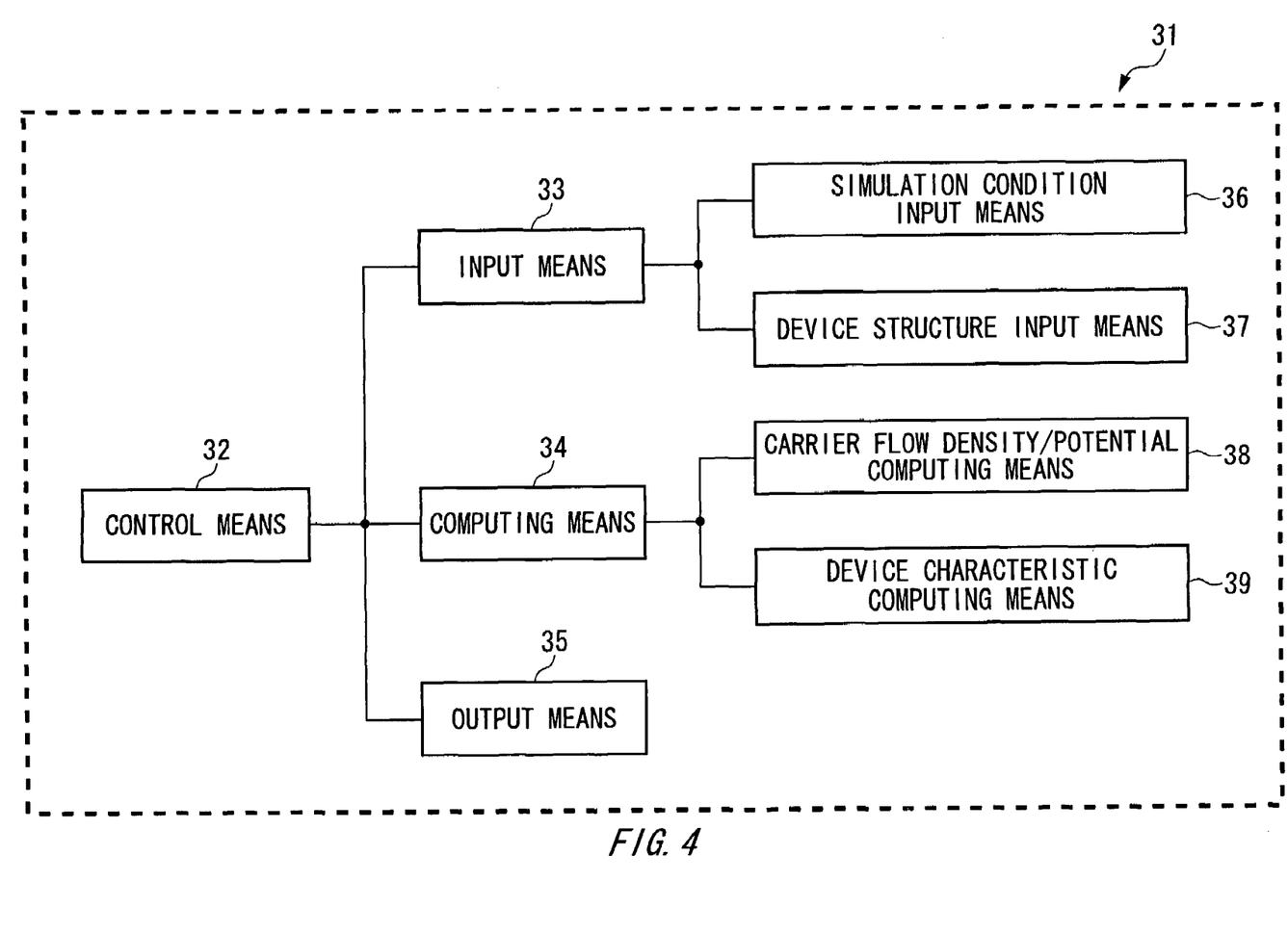
FIG. 4 is a block diagram of a device simulator for fabricating the semiconductor device according to the present invention.

FIG. 4 is a block diagram showing a device simulator for simulating the device characteristics of the semiconductor device of the present invention.

The device simulator 31 is constituted by control means 32, input means 33, computing means 34, and output means 35, the control means 32 being means for controlling the whole of the device simulator 31.

Also, the input means 33 is constituted by simulation condition input means 36 for inputting simulation conditions such as the gate voltage to be applied, and by device structure input means 37 for inputting the structure and shape of semiconductor devices as well as the physical parameters of semiconductor layers. The computing means 34 are constituted by carrier flow density/potential computing means 38 for calculating the density of the flow of carriers flowing in the device on the basis of the above-described theory, and by device characteristic computing means 39 for calculating the desired device characteristics on the basis of the corresponding results and of a variety of conditions inputted by the input means 33.

Figure 5:
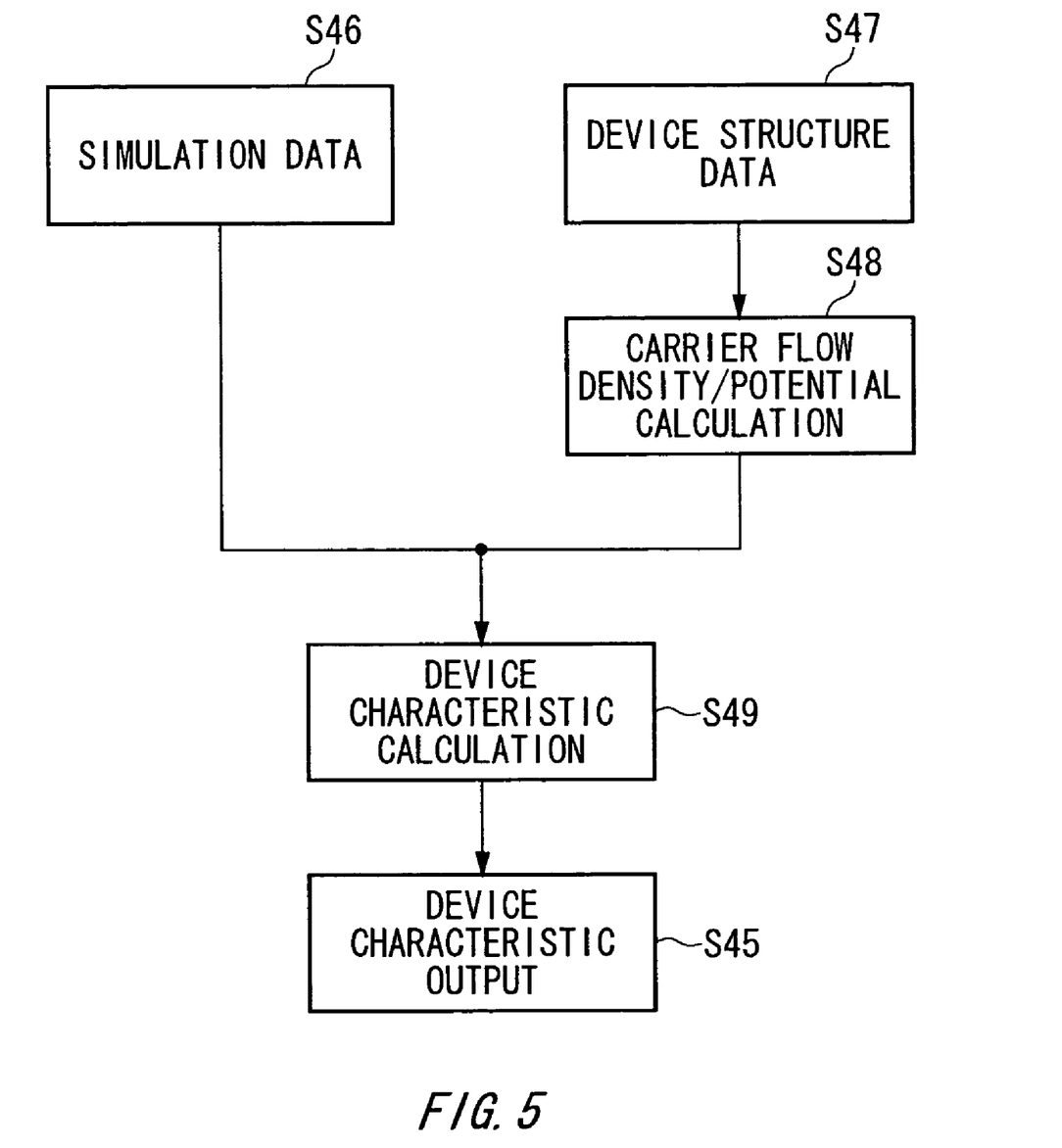
FIG. 5 is a flowchart that illustrates the operation of the device simulator for fabricating the semiconductor device according to the present invention.

FIG. 5 shows the processing procedure when a device simulation is executed by the device simulator 31.

First of all, simulation data such as the gate voltage condition for the semiconductor device is inputted by the simulation condition input means 36 of the input means 33 (S46).

Further, data that relates to the device structure such as the structure and shape of the semiconductor device, and so forth, is inputted via the device structure input means 37 (S47) Here, 'device structure data' refers to the gate oxide film thickness, source-drain gap, semiconductor layer physicality, contact hole formation, wiring formation, dopant concentration, and the like, for example, and the nature of this data can be designed freely in accordance with the device which is to be designed. Further, the device structure data may be inputted directly by the user of the device simulator 31, and the device simulator 31 may be a device for inputting data which is calculated by a process simulator which is provided separately.

The carrier flow density/potential computing means 38 receive (S48) device structure data from the device structure input means 37 and calculate the carrier flow density and the potential on the basis of the above-described relations.

Further, the device characteristic computing means 39 calculate (S49) device characteristics such as the C-V characteristic upon receiving the above-mentioned simulation data and the values for the carrier flow density and the potential thus calculated, and then the results are outputted (S45) by the output means 35.

By repeating the procedure shown in FIG. 5 while comparing the outputted device characteristics and the design characteristics, the user of the device simulator 31 optimizes a device structure achieving the desired characteristics, by optimizing device parameters such as the gate oxide film thickness, source-drain gap, semiconductor layer physicality, contact hole formation, wiring formation, and the dopant concentration.

(Structure of Thin Film Transistor)

A description will be provided next for the fabrication steps of the thin film transistor according to the present invention that has the device structure determined by means of the above-described device simulation, with reference to the drawings.

FIG. 6 shows the fabrication steps of the polycrystalline thin film transistor according to the present invention. In this embodiment, a case of depositing, on an insulating substrate such as glass, a silicon thin film constituting a semiconductor layer that forms a transistor will be described by way of example.

First, using a reactant gas such as silane gas as a silicon atom supply source, an amorphous silicon film 2 is deposited on the insulating substrate 1 by means of low pressure CVD (LPCVD) that uses disilane ($Si_2H_6$) gas, for example, or plasma enhancement CVD (PECVD) that uses monosilane ($SiH_4$) gas, for example. Here, the silicon film 2 is deposited such that the corresponding film thickness is the film thickness which was calculated beforehand as optimum by means of the above-described device simulation.

Thereafter, a polycrystalline silicon film 2, which is re-crystallized by supplying, from outside, the energy required for crystallization of silicon atoms in an amorphous state, is formed on the deposited amorphous silicon film 2 (FIG. 6($a$)). Here, the crystal characteristics such as the polycrystalline grain size and the crystal orientation, and so forth are preset such that various characteristics such as the required carrier mobility are obtained by the above-described device simulation. Further, with regard to the re-crystallization procedure, the optimum procedure and conditions are selected in order to implement these crystal characteristics, laser crystallization that involves light radiation using an excimer laser or similar as shown in FIG. 6($a$), or a procedure that induces solid-phase growth by performing thermal processing in a thermal processing furnace, and so forth, for example, being selected.

Figure 6A:
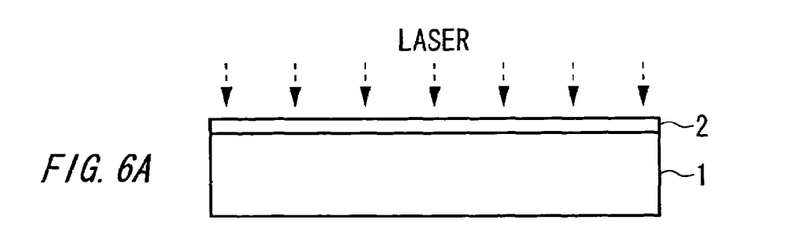
FIG. 6 serves to illustrate the fabrication steps for a polycrystalline silicon thin film transistor.
Figure 6B:
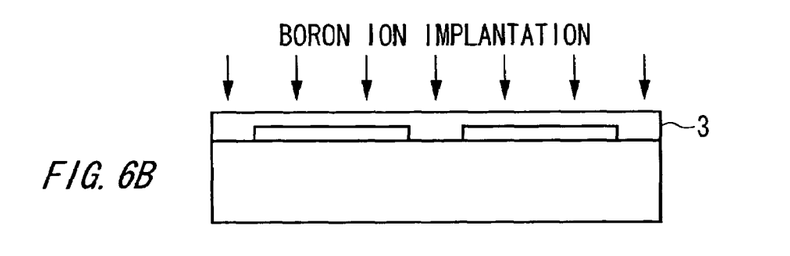

The polycrystalline silicon film 2 thus formed is subjected to desired patterning using a photolithography technique, and a dielectric film 3 which is to be subsequently used as a gate oxide film is formed. This dielectric film is, for example, a silicon oxide film (SiOx) formed by thermal CVD, and is deposited over the whole substrate (FIG. 6($b$)).

The semiconductor layer is doped with impurities in order to regulate the threshold value, ion implantation that allows accurate doping level control to be performed easily and accurately being adopted here. The types of chemical elements which are to be used for the doping are determined by the design of the thin film transistor. In this embodiment, a case where an n-type thin film transistor is used is illustrated, and boron (B), which is a Group III impurity that acts as an acceptor, is implanted in the silicon crystal (FIG. 6($b$)). Further, the doping amount for ion implantation is set at a value that is calculated beforehand by means of simulation.

Following the above step of doping the semiconductor layer, thin film formation is carried out to form a gate electrode 4. After a thin film of polysilicon or metal selected as the gate electrode material has been deposited over the whole of the substrate by means of CVD or sputtering, or the like, patterning for the desired gate electrode shape is performed by means of photolithography (FIG. 6(c)).

Figure 6C:
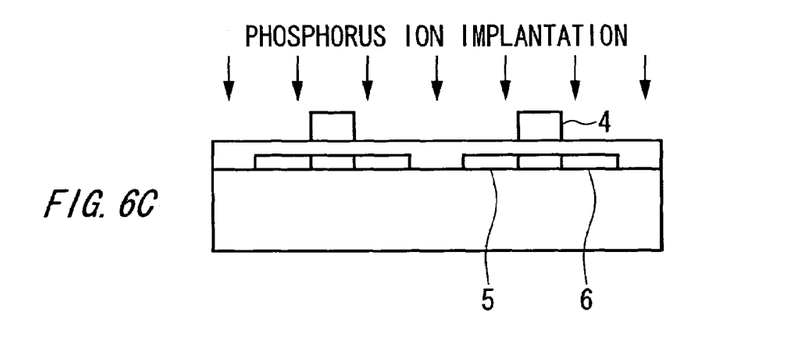

In addition, in order to make the conductivity type of a source region 5 and a drain region 6 an n+ conductivity type, phosphorus (P) is ion-implanted, for example (FIG. 6(c)). In this step, the already patterned gate electrode 4 is used as a mask and phosphorus (P) is implanted by means of self-alignment. In other words, phosphorus is not implanted in the polycrystalline silicon film region directly below the gate electrode, the boron ion implantation state of step FIG. 6(b) being maintained.

After boron has been implanted into the semiconductor layer region and phosphorus has been implanted in the source region 5 and the drain region 6, processing is performed in order to restore the crystal lattice state that has been disturbed by this ion implantation and to electrically activate the boron and phosphorus as dopants.

A variety of methods are known for this dopant activation. However, if thermal activation in which the substrate is held at a high temperature over a long period is selected, there is the benefit that the fabrication of the thin film transistor can be performed at a low cost because the dopant activation can be executed using a simple device. Further, the dopant activation is not limited to the above-mentioned thermal activation and may be performed by means of laser activation, for example. In cases where dopant activation is performed by means of laser activation, a laser light source that is the same as the laser employed in the amorphous silicon thin film crystallization step shown in FIG. 6(a) may be used, or another laser light source with a different wavelength may be provided and used.

Figure 6D:
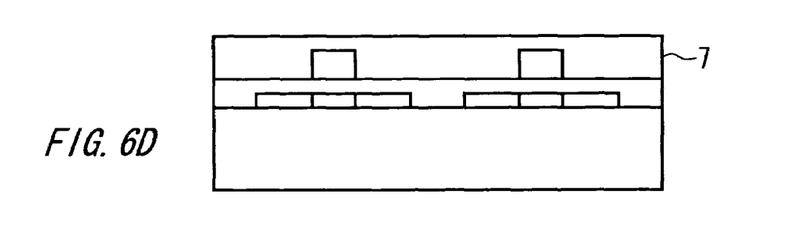
Figure 6E:
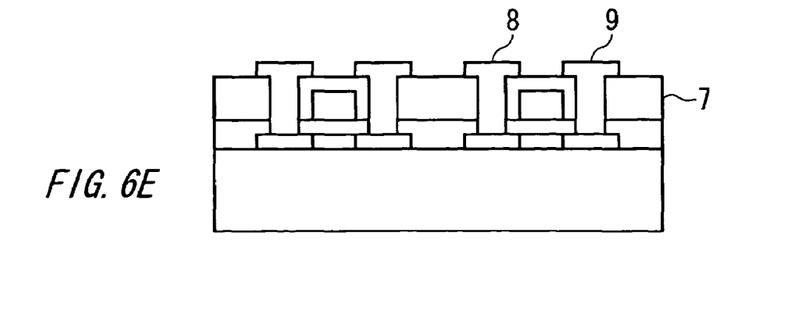

Following the above-described dopant activation, an intermediate insulating film 7 is formed (FIG. 6(d)), this film serving to electrically isolate individual transistors formed on the substrate from one another, and the dielectric film 3 and intermediate insulation film 7 formed on the source region 5 and the drain region 6 are removed by means of a photolithographic technique to create a contact hole, and then a thin film for a source electrode 8 and a drain electrode 9 is deposited and then patterned for the source electrode 8 and drain electrode 9. A polycrystalline thin film transistor is thus completed (FIG. 6(d)).

Further, in this embodiment, the conductivity type of the semiconductor layer is the p-type conductivity type and the boron is selected as the implanted dopant such that the gate voltage-drain current characteristic shifts toward the positive voltage side. However, it goes without saying that another acceptor impurity such as aluminum (Al), for example, could also be selected as the dopant. Further, depending on the demands of the transistor design, the semiconductor layer could also be the n-type conductivity type. In such a case, a donor impurity such as phosphorus (P) may be selected as the dopant.

In the above embodiment, an example was illustrated in which ion implantation accompanied by dopant mass spectrometry was selected as the procedure for doping the semiconductor layer, but the doping procedure is not limited to such a procedure. In other words, another doping method that performs doping without same being accompanied by dopant mass spectrometry is also acceptable. More particularly, in a case where ion doping without mass spectrometry is adopted, there is the advantage of a decrease being permitted in the electrical defects such as fixed charge defects, and structural defects such as dislocation which are present in the semiconductor layer undergoing ion implantation, gate insulation film, or substrate insulation film, or at the interface therebetween. On the other hand, in a case where ion implantation accompanied by mass spectrometry is adopted, electrical defects such as fixed charge defects, and structural defects such as dislocation which are induced in the semiconductor layer, gate insulation film, and substrate insulation film, or at the interface therebetween, as a result of the impact of excess ions, can be suppressed. The optimum procedure for obtaining the desired thin film transistor characteristics may therefore be suitably selected.

Furthermore, the doping of the semiconductor layer need not be performed after the polycrystallization step of the amorphous silicon layer, and may instead be carried out at the same time as the deposition of the amorphous silicon. For example, in a case where doping is performed by means of ion doping, by depositing an amorphous silicon film by simultaneously using a gas containing the silicon element that is the base material of the transistor, and a gas that contains the dopant element, an amorphous silicon film containing the dopant impurity can be obtained.

Further, it goes without saying that the steps for doping the channel region, the source region and the drain region with impurities may be established in any order as long as the doping of these layers is achieved. The channel region need not necessarily be doped.

Further, in the present embodiment, the device simulation method according to the present invention is applied to a polycrystalline silicon thin film transistor that employs polycrystalline silicon for the semiconductor layer. However, this method could also be applied to a polycrystalline semiconductor device that employs another polycrystalline material such as GaAs for the semiconductor layer.

Figure 7A:
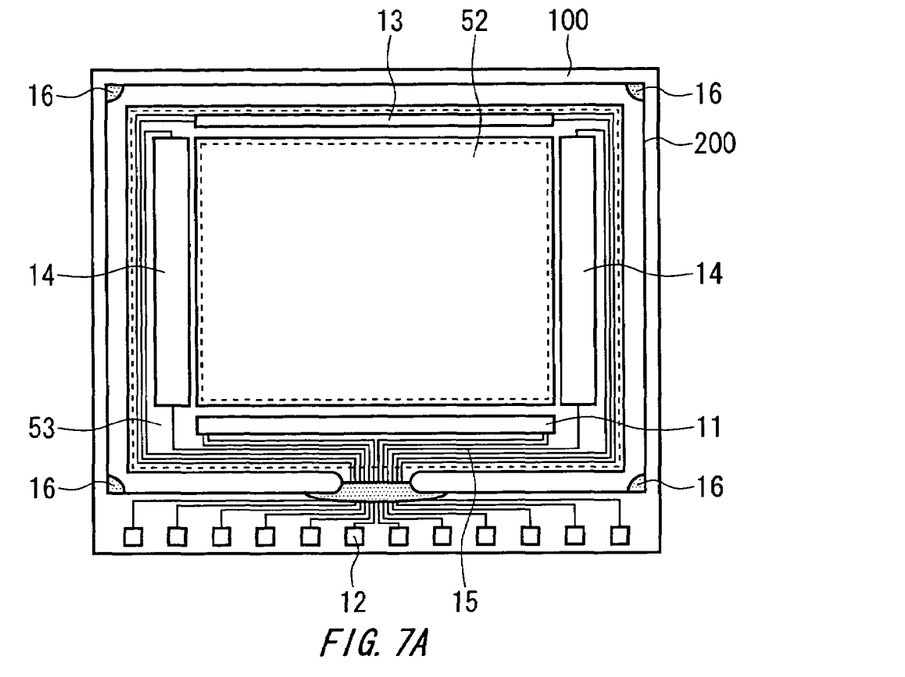
FIG. 7 shows the overall constitution of a liquid crystal device which is one example of the electro-optical apparatus of the present embodiment, and provides an enlarged view of part of this device.

FIG. 7 shows the overall constitution of a liquid crystal device which is one example of the electro-optical apparatus of the present embodiment, and provides an enlarged view of part of this device. FIG. 7(a) shows the overall constitution of the liquid crystal device. This liquid crystal device has liquid crystals sealed between a pair of substrates, and comprises an active matrix substrate 100 formed with a thin film transistor constituting a first substrate, and an opposing substrate 200 constituting the other substrate which is disposed so as to lie opposite the first substrate. The active matrix substrate 100 is secured to the opposing substrate 200 by means of fixing portions 16.

The active matrix substrate 100 is one example of a circuit board that comprises the thin film transistor constituting the semiconductor device according to the present invention. Further, the reference symbol 53 indicates the non-display region which is a region outside the pixel region 52. The non-display region 53 is provided with a data line drive circuit 11 and external circuit connection terminals 12 along one side of the active matrix substrate 100, with scan line drive circuits 14 along two sides adjoining this one side, and a pre-charge circuit 13 that follows the one side that remains. The external circuit connection terminals 12, data line drive circuit 11, scan line drive circuits 14, and pre-charge circuit 13 are electrically connected via wiring 15.

Figure 7B:
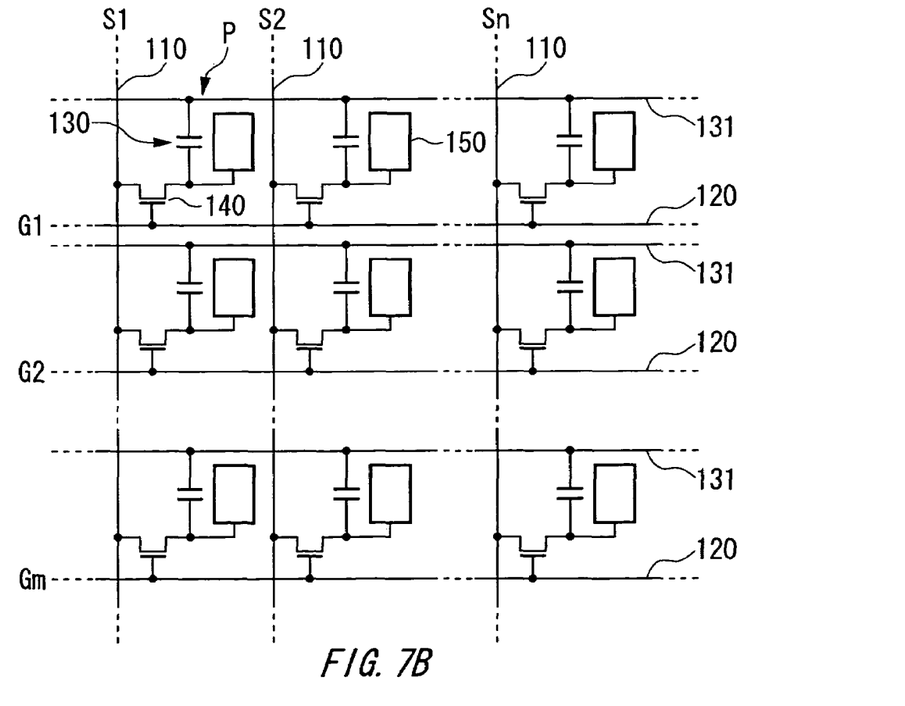

Further, FIG. 7(b) is an enlarged view of part of the pixel region 52. Here, the pixels P are constituted comprising switching thin film transistors (TFT) 140 which are supplied with scanning signals G1, G2, . . . Gm via scan lines 120; pixel electrodes 150 to which pixel signals S1, S2, . . . Sn are supplied via these TFT 140 from signal lines 110; and storage capacitors 130 which are connected in parallel with the pixel electrodes 150 and which hold the pixel signals for a fixed period. The storage capacitors 130 store charges based on the difference in potential between the signal lines 100 and wiring 131, and, even after the thin film transistors 140 turn OFF, supply electric power to the pixel electrodes 150 for a predetermined period.

The thin film transistor constituting the semiconductor device of the present invention can be applied as the switching thin film transistors 140 and can also be applied to the thin film transistors mounted in the data line driver circuit 11, scan line driver circuits 14, and so forth.

Figure 8:
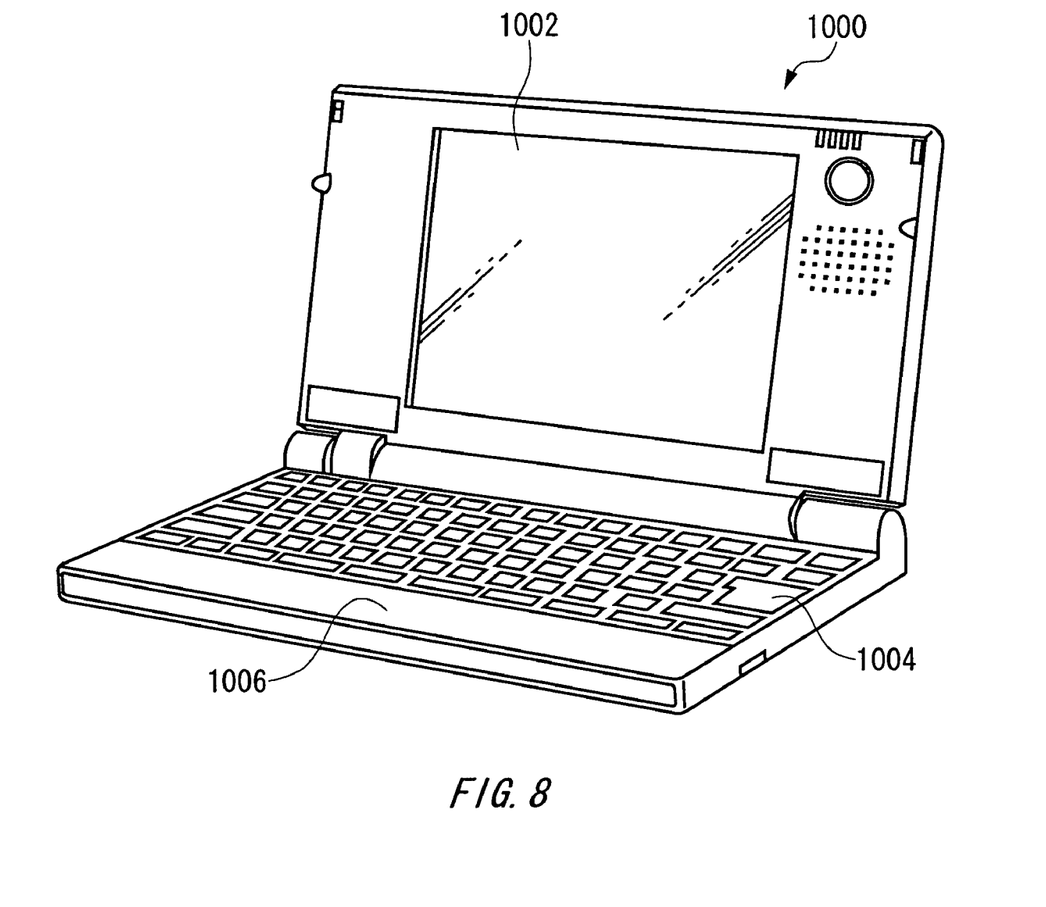
FIG. 8 is a perspective view showing the constitution of a personal computer 1000 which is an example of an electronic device that comprises the semiconductor device and/or electro-optical apparatus of the present invention.

FIG. 8 is a perspective view showing the constitution of a personal computer 1000 which is an example of an electronic device that comprises the semiconductor device and/or electro-optical apparatus of the present invention. In FIG. 8, the personal computer 1000 comprises a display panel 1002, and a main body 1006 that comprises a keyboard 1004. The semiconductor device according to the present invention is utilized in an internal circuit board of main body 1006 of this personal computer 1000. Further, the electro-optical apparatus according to the present invention is used in the display panel 1002, The embodiment examples and application examples described by way of the above embodiments of the invention can be suitably combined depending on usage or can be used after modifications or improvements have been added, the present invention not being limited to or by the statements of the above-described embodiments. It is clear from the language of the scope of the claims that embodiments that are produced by means of such combination or by adding modifications or improvements may also be included in the technological scope of the present invention.

What is claimed is:

1. A semiconductor device simulation method comprising:
   dividing a semiconductor device of a two-dimensional structure or three-dimensional structure into meshes; and
   solving physical equations including a potential equation and a carrier transport equation, for each of said meshes,
   wherein a drift current resulting from an electric field and a diffusion current caused by a carrier density gradient are applied separately.

2. The semiconductor device simulation method according to claim 1, wherein mobility, which is expressed by an equation for said drift current, and a diffusion coefficient, which is expressed by an equation for said diffusion current, are applied as independent constants.

3. The semiconductor device simulation method according to claim 1, wherein the semiconductor device is an organic thin film transistor.

4. A semiconductor device comprising device parameters that are determined based on potential, carrier density and carrier flow density, said potential, said carrier density and said carrier flow being calculated by a semiconductor device simulation method which divides said semiconductor device of a two-dimensional structure or three-dimensional structure into meshes and solves physical equations including a potential equation and a carrier transport equation, for each of said meshes, and said semiconductor device simulation method calculating said potential, said carrier density and said carrier flow by applying separately a drift current resulting from an electric field and a diffusion current caused by a carrier density gradient.

5. A circuit board, comprising the semiconductor device according to claim 4.

6. An electro-optical apparatus, comprising the semiconductor device according to claim 4.

7. An electronic device, comprising the electro-optical apparatus according to claim 6.

8. A semiconductor device simulation method which divides a semiconductor device into a plurality of regions, and calculates device characteristics of the semiconductor device by solving physical equations which include a drift current term based on a drift current generated by carrier drift and a diffusion current term based on a diffusion current produced by diffusion of the carriers, for each of said divided regions, comprising:
   an extraction step of extracting said drift current term and said diffusion current term from said physical equations;
   a substitution step of substituting mobility of said carriers in said plurality of regions for the respective drift current term that was extracted, substituting a diffusion coefficient of said carriers in said plurality of regions for the respective diffusion current term that was extracted, and calculating the drift current term and the diffusion current term;
   a generating step of generating said physical equations for the plurality of regions based on the drift current term and the diffusion current term calculated in the substitution step; and
   a calculating step of calculating said device characteristics by solving said plurality of physical equations that were generated.

9. The semiconductor device simulation method according to claim 8, wherein said generating step generates said physical equations by calculating a vector sum of said drift current term and said diffusion current term which are calculated in said substitution step, and said calculating step solves said physical equations by performing a matrix calculation based on said plurality of physical equations.

10. A semiconductor device fabrication method, comprising a step of designing a semiconductor device by means of the semiconductor device simulation method according to claim 9.

11. The semiconductor device simulation method according to claim 8, wherein said calculating step calculates the mobility distribution and the diffusion coefficient distribution of said semiconductor device as said device characteristics.

12. A semiconductor device fabrication method, comprising a step of designing a semiconductor device by means of the semiconductor device simulation method according to claim 11.

13. The semiconductor device simulation method according to claim 8, wherein said carrier mobility and said diffusion coefficient of said semiconductor device do not satisfy Einstein's relation.

14. A semiconductor device fabrication method, comprising a step of designing a semiconductor device by means of the semiconductor device simulation method according to claim 13.

15. A semiconductor device fabrication method, comprising a step of designing a semiconductor device by means of the semiconductor device simulation method according to claim 8.

16. An electro-optical apparatus, comprising the semiconductor device fabricated by the semiconductor device fabrication method according to claim 15.

17. An electronic device, comprising the electro-optical apparatus according to claim 16.

* * * * *